(12) United States Patent
Geng et al.

(10) Patent No.: US 12,048,124 B2
(45) Date of Patent: Jul. 23, 2024

(54) FAN ASSEMBLY AND SERVER

(71) Applicants: SQ Technology (Shanghai) Corporation, Shanghai (CN); INVENTEC CORPORATION, Taipei (TW)

(72) Inventors: Zhao Geng, Shanghai (CN); Guang-Zhao Tian, Shanghai (CN)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 164 days.

(21) Appl. No.: 17/839,701

(22) Filed: Jun. 14, 2022

(65) Prior Publication Data
US 2023/0301031 A1    Sep. 21, 2023

(30) Foreign Application Priority Data
Mar. 16, 2022   (CN) .......................... 202210262336.X

(51) Int. Cl.
*H05K 7/20* (2006.01)
*H05K 1/02* (2006.01)
*H05K 1/09* (2006.01)

(52) U.S. Cl.
CPC ....... *H05K 7/20727* (2013.01); *H05K 1/0201* (2013.01); *H05K 1/09* (2013.01); *H05K 7/20172* (2013.01)

(58) Field of Classification Search
CPC .................................................. H05K 1/0201
See application file for complete search history.

(56) References Cited

U.S. PATENT DOCUMENTS

| | | | |
|---|---|---|---|
| 7,515,413 B1 * | 4/2009 | Curtis | H05K 7/20172 415/213.1 |
| 2017/0086332 A1 * | 3/2017 | Jaskela | H05K 7/1487 |
| 2021/0120710 A1 * | 4/2021 | Tsorng | F04D 29/601 |

FOREIGN PATENT DOCUMENTS

WO    WO-2022025731 A1 *   2/2022   ......... H05K 7/20909

OTHER PUBLICATIONS

English translation of WO 2022025731 A1 (Year: 2022).*

* cited by examiner

*Primary Examiner* — Mukundbhai G Patel
(74) *Attorney, Agent, or Firm* — Locke Lord LLP; Tim Tingkang Xia, Esq.

(57) ABSTRACT

This invention provides a fan assembly including a mounting bracket, a fan and a circuit board assembly. The fan is disposed in the mounting bracket. The circuit board assembly includes a circuit board and a plurality of gold fingers. The plurality of gold fingers are disposed on and electrically connected to the circuit board. The circuit board is disposed on the mounting bracket and electrically connected to the fan.

8 Claims, 3 Drawing Sheets

FAN ASSEMBLY AND SERVER

CROSS-REFERENCE TO RELATED APPLICATIONS

This non-provisional application claims priority under 35 U.S.C. § 119(a) on Patent Application No(s). 202210262336.X filed in China, on Mar. 16, 2022, the entire contents of which are hereby incorporated by reference.

BACKGROUND OF THE INVENTION

Technical Field of the Invention

The invention relates to a fan assembly and a server, more particularly to a fan assembly and a server that include at least one gold finger.

Description of the Related Art

In general, since one or more heat sources included in a server generate a large amount of heat, a plurality of fans should be disposed in the server to effectively dissipate such heat via an airflow blown by the fans. In addition, the fans are electrically connected to a motherboard via back panels. Specifically, in a conventional server, male electrical connectors are disposed on the fans, female electrical connectors are disposed on the back panels, and the fans are electrically connected to the back panels by plugging the male electrical connectors into the female electrical connectors.

However, the male electrical connectors disposed on the fan usually have a height that is not negligible and thus the airflow blown by the fan is at least partially disturbed by the male electrical connectors. That is, the conventional server can hardly maintain the electrical connection between the fan and the back panel while prevent the airflow blown by the fan from being disturbed. Further, when the airflow blown by the fan is disturbed, the heat dissipation efficiency of the fan is reduced.

SUMMARY OF THE INVENTION

The invention is to provide a fan assembly and a server to maintain the electrical connection between the fan and the back panel while prevent the airflow blown by the fan from being disturbed, thereby preventing the heat dissipation efficiency of the fan from being reduced.

One embodiment of this invention provides a fan assembly including a mounting bracket, a fan and a circuit board assembly. The fan is disposed in the mounting bracket. The circuit board assembly includes a circuit board and a plurality of gold fingers. The plurality of gold fingers are disposed on and electrically connected to the circuit board. The circuit board is disposed on the mounting bracket and electrically connected to the fan.

Another embodiment of this invention provides a server including a chassis, a motherboard assembly, at least one fan assembly and a control circuit board assembly. The motherboard assembly is disposed in the chassis. The at least one fan assembly includes a mounting bracket, a fan and a circuit board assembly. The mounting bracket is disposed in the chassis. The fan is disposed in the mounting bracket. The circuit board assembly includes a circuit board and a plurality of gold fingers. The plurality of gold fingers are disposed on and electrically connected to the circuit board. The circuit board is disposed on the mounting bracket and electrically connected to the fan. The control circuit board assembly includes a control circuit board and at least one connector. The at least one connector is disposed on and electrically connected to the control circuit board. The control circuit board is electrically connected to the motherboard assembly. The circuit board assembly of the fan assembly is plugged into the at least one connector to electrically connect the plurality of gold fingers to the at least one connector.

According to the fan assembly and the server disclosed in the above embodiments, the circuit board assembly of the fan assembly includes gold fingers that are disposed on and electrically connected to the circuit board, and is electrically connected to the control circuit board assembly via the gold fingers. Also, heights of the gold fingers relative to the circuit board are negligible. Thus, the gold fingers can hardly disturb the airflow blown by the fan. Accordingly, the heat dissipation efficiency of the fan is prevented from being reduced.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
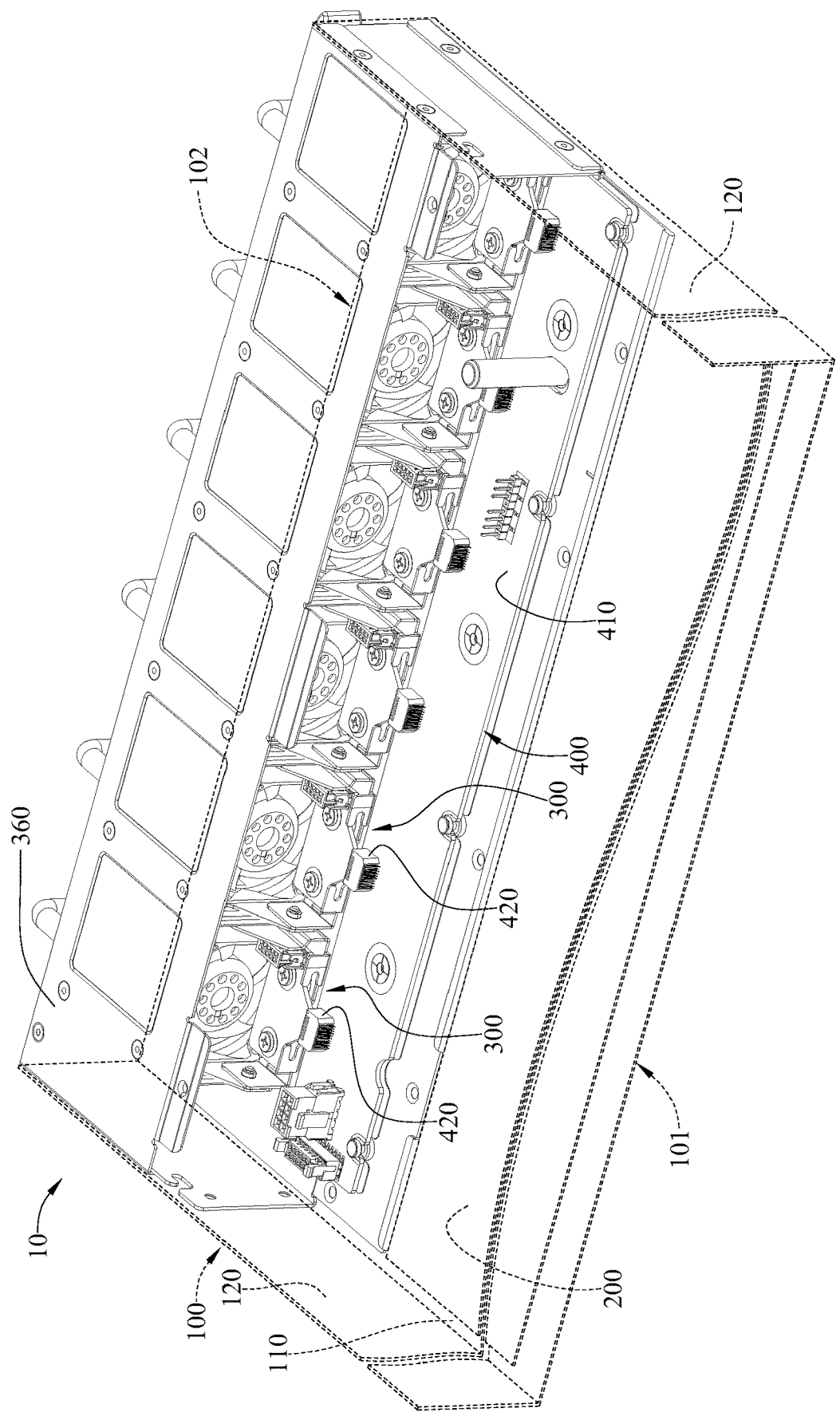
FIG. 1 is a partially enlarged perspective view of a server according an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
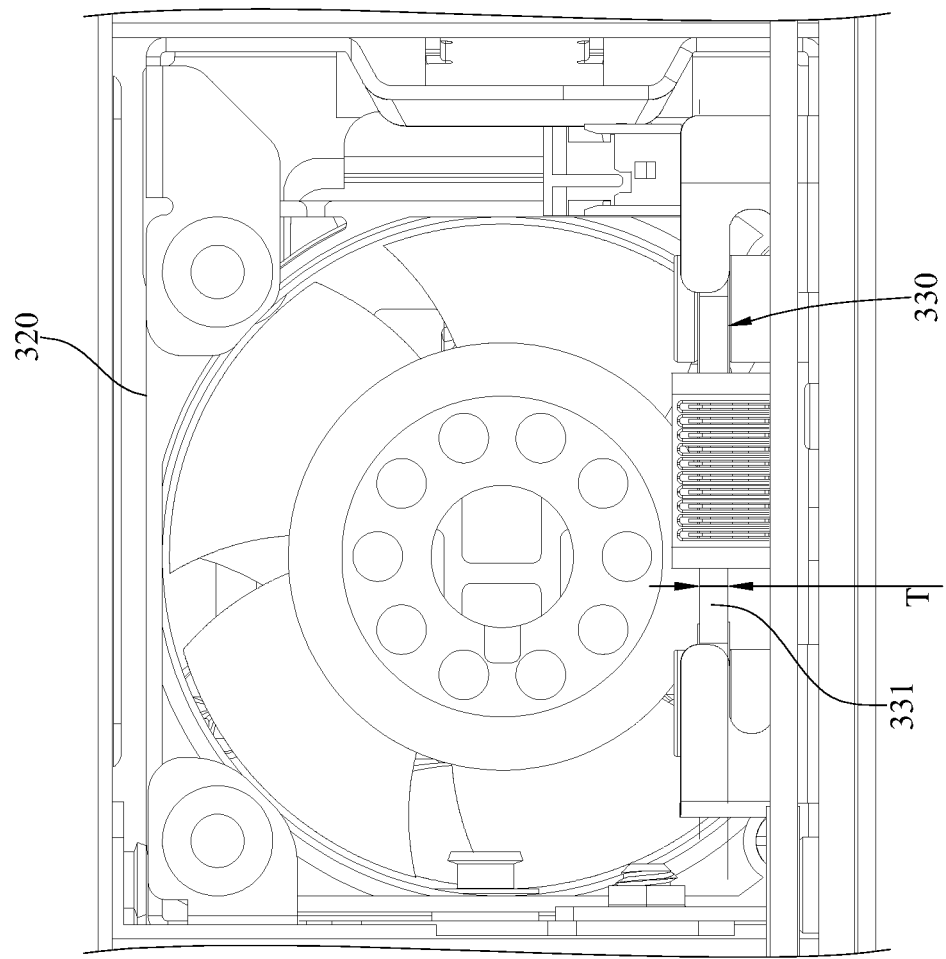
FIG. 2 is a partially enlarged front view of the server in FIG. 1.
Figure 3:
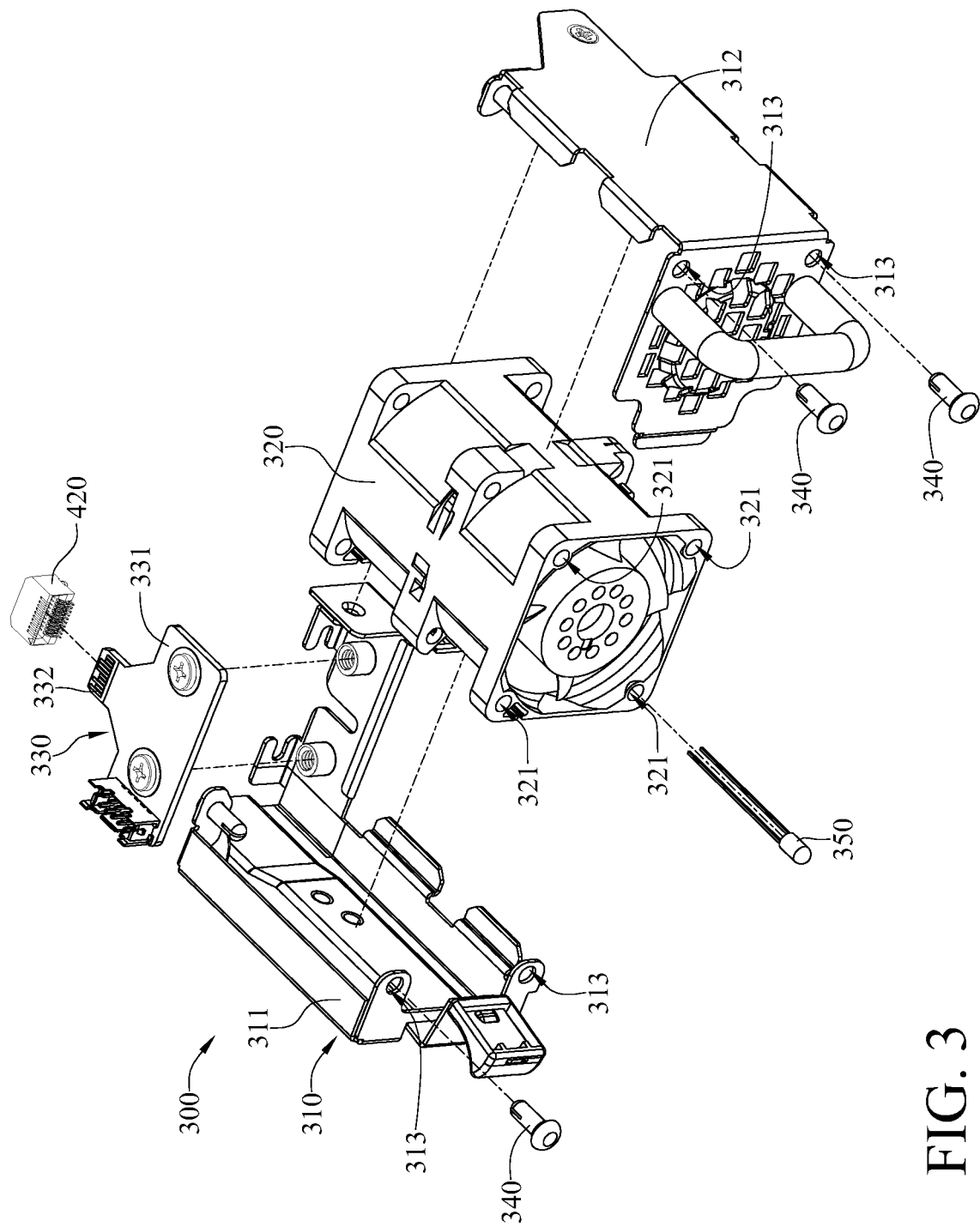
FIG. 3 is a perspective exploded view showing a fan assembly and a connector of a control circuit board assembly of the server in FIG. 1.

Please refer to FIGS. 1 to 3, where FIG. 1 is a partially enlarged perspective view of a server 10 according an embodiment of the invention, FIG. 2 is a partially enlarged front view of the server 10 in FIG. 1, and FIG. 3 is a perspective exploded view showing a fan assembly 300 and a connector 420 of a control circuit board assembly 400 of the server 10 in FIG. 1.

In this embodiment, the server 10 includes a chassis 100, a motherboard assembly 200, a plurality of fan assemblies 300, a mounting cage 360 and the control circuit board assembly 400.

The chassis 100 includes a bottom plate 110 and two side plates 120. The two side plates 120 stand on two opposite sides of the bottom plate 110, respectively. In addition, the chassis 100 has a front side 101 and a rear side 102 that are opposite to each other. For example, when the server 10 is disposed in a cabinet (not shown), the front side 101 of the chassis 100 is located closer to an opening of the cabinet that allows the server 10 to be disposed in or removed from the cabinet therethrough than the rear side 102. Note that for the convenience of the illustration, a top plate (not shown)

disposed on sides of the side plates 120 that are located farthest from the bottom plate 110 are omitted in FIGS. 1 and 2.

The motherboard assembly 200 is disposed on the bottom plate 110 of the chassis 100. In addition, the motherboard assembly 200 includes, for example, at least one central processing unit (not shown), at least one graphics processing unit (not shown) and at least one memory (not shown).

Since the fan assemblies 300 are similar in structure, only the detail structure of one fan assembly 300 will be described hereinafter. In this embodiment, the fan assembly 300 includes a mounting bracket 310, a fan 320, a circuit board assembly 330, three fasteners 340 and a light emitting component 350.

In this embodiment, the mounting bracket 310 includes a first bracket 311 and a second bracket 312. The first bracket 311 and the second bracket 312 are fixed to each other and are disposed in the chassis 100 via the mounting cage 360. In this embodiment, the mounting bracket 310 of the fan assembly 300 is disposed on the rear side 102 of the chassis 100 and is exposed to the outside. Therefore, the inner space of the chassis 100 can be utilized more efficiently and the fan assembly 300 can have a function of hot plugging to save the time for maintenance. Note that in other embodiments, the fan assembly may be located between the front side and the rear side of the chassis.

The fan 320 is disposed on the first bracket 311 and the second bracket 312. In this embodiment, the fan 320 has four first fastening holes 321. The mounting bracket 310 has four second fastening holes 313. Two of the second fastening holes 313 are located on the first bracket 311, and the other two second fastening holes 313 are located on the second bracket 312. In this embodiment, the fan 320 is, for example a dual-rotor fan.

The circuit board assembly 330 includes a circuit board 331 and a plurality of gold fingers 332. The gold fingers 332 are disposed on and electrically connected to the circuit board 331. The gold fingers 332 are, for example, metal pads. The circuit board 331 is disposed on the mounting bracket 310 and is electrically connected to the fan 320. As shown in FIG. 2, for example, in this embodiment, a thickness T of the circuit board 331 of the circuit board assembly 330 is smaller than 1.6 millimeters (mm) so that the circuit board 331 can hardly disturb the airflow blown by the fan 320.

The three fasteners 340 are, for example, rivets. The three fasteners 340 are fastened in three of the first fastening holes 321 of the fan 320, respectively. The three fasteners 340 are fastened in one of the second fastening holes 313 on the first bracket 311 and two of the second fastening holes 313 on the second bracket 312, respectively.

The light emitting component 350 is disposed in the other one first fastening hole 321 and is exposed from the other one second fastening hole 313 on the first bracket 311. The light emitting component 350 is electrically connected to the circuit board 331 via, for example, one or more cables. The light emitting component 350 is, for example, a light emitting diode. Since the light emitting component 350 is directly exposed to the outside, a light guide pillar (not shown) for guiding the light emitted from the light emitting component 350 out of the fan assembly 300 can be omitted, and the structure for fixing the light guide pillar and the light emitting component 350 can also be omitted. Thus, the manufacture cost of the fan assembly 300 is reduced. Note that in other embodiments, the light emitting component may be disposed on the fan and may be spaced apart from the first fastening holes and the second fastening holes. Alternatively, in still other embodiments, the fan assembly may not include the light emitting component 350.

The control circuit board assembly 400 includes a control circuit board 410 and a plurality of connectors 420. The connectors 420 are disposed and electrically connected to the control circuit board 410. The control circuit board 410 is electrically connected to the motherboard assembly 200. The circuit board assemblies 330 of the fan assemblies 300 are plugged into the connectors 420, respectively. Thus, the gold fingers 332 are electrically connected to the connectors 420. In this embodiment, the control circuit board assembly 400 is configured to control the operation of the fan 320 (e.g., configured to control the speed of the fan 320 according to the inner temperature of the server 10).

In this embodiment, the circuit board 331 of the circuit board assembly 330 of the fan assembly 300 and the control circuit board 410 of the control circuit board assembly 400 are parallel to the bottom plate 110, and thus the airflow blown by the fan 320 can smoothly flow in the server 10, but the invention is not limited thereto. In other embodiments, the circuit board of the circuit board assembly of the fan assembly and the control circuit board of the control circuit board assembly may be perpendicular to the bottom plate.

In this embodiment, the control circuit board assembly 400 is located between the motherboard assembly 200 and the fan assembly 300, but the invention is not limited thereto. In other embodiments, the control circuit board assembly may be located on a side of the fan assembly that is located farthest from the motherboard assembly.

According to the fan assembly and the server disclosed in the above embodiments, the circuit board assembly of the fan assembly includes gold fingers that are disposed on and electrically connected to the circuit board, and is electrically connected to the control circuit board assembly via the gold fingers. Also, heights of the gold fingers relative to the circuit board are negligible. Thus, the gold fingers can hardly disturb the airflow blown by the fan. Accordingly, the heat dissipation efficiency of the fan is prevented from being reduced.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A fan assembly, comprising:
    a mounting bracket;
    a fan, disposed in the mounting bracket; and
    a circuit board assembly, comprising a circuit board and a plurality of gold fingers, wherein the plurality of gold fingers are disposed on and electrically connected to the circuit board, and the circuit board is disposed on the mounting bracket and electrically connected to the fan;
    wherein the fan assembly further comprises at least one fastener and a light emitting component, the fan has at least two first fastening holes, the mounting bracket has at least two second fastening holes, the at least one fastener is fastened in one of the at least two first fastening holes and one of the at least two second fastening holes, the light emitting component is disposed in another one of the at least two first fastening holes and another one of the at least two second fastening holes, and the light emitting component is electrically connected to the circuit board.

2. The fan assembly according to claim 1, wherein the fan is a dual-rotor fan.

3. The fan assembly according to claim 1, wherein a thickness of the circuit board of the circuit board assembly is smaller than 1.6 millimeters.

4. A server, comprising:
   a chassis;
   a motherboard assembly, disposed in the chassis;
   at least one fan assembly, comprising:
      a mounting bracket, disposed in the chassis;
      a fan, disposed in the mounting bracket; and
      a circuit board assembly, comprising a circuit board and a plurality of gold fingers, wherein the plurality of gold fingers are disposed on and electrically connected to the circuit board, and the circuit board is disposed on the mounting bracket and electrically connected to the fan; and
   a control circuit board assembly, comprising a control circuit board and at least one connector, wherein the at least one connector is disposed on and electrically connected to the control circuit board, the control circuit board is electrically connected to the motherboard assembly, the circuit board assembly of the fan assembly is plugged into the at least one connector to electrically connect the plurality of gold fingers to the at least one connector;
   wherein the fan assembly further comprises at least one fastener and a light emitting component, the fan has at least two first fastening holes, the mounting bracket has at least two second fastening holes, the at least one fastener is fastened in one of the at least two first fastening holes and one of the at least two second fastening holes, the light emitting component is disposed in another one of the at least two first fastening holes and another one of the at least two second fastening holes, and the light emitting component is electrically connected to the circuit board.

5. The server according to claim 4, wherein the chassis comprises a bottom plate and two side plates, the two side plates stand on two opposite sides of the bottom plate, respectively, the circuit board of the circuit board assembly of the fan assembly and the control circuit board of the control circuit board assembly are parallel to the bottom plate.

6. The server according to claim 5, wherein the control circuit board assembly is located between the motherboard assembly and the fan assembly.

7. The server according to claim 4, wherein the chassis has a front side and a rear side that are opposite to each other, and the mounting bracket of the fan assembly is disposed on the rear side of the chassis and is exposed to the outside.

8. The server according to claim 4, wherein the fan is a dual-rotor fan.

* * * * *